(12) United States Patent
Huang

(10) Patent No.: US 11,587,351 B2
(45) Date of Patent: Feb. 21, 2023

(54) DISPLAY AND INPUT APPARATUS

(71) Applicant: Shanghai OXi Technology Co., Ltd, Shanghai (CN)

(72) Inventor: Zhongshou Huang, Shanghai (CN)

(73) Assignee: Shanghai OXi Technology Co., Ltd, Shanghai (CN)

( * ) Notice: Subject to any disclaimer, the term of this patent is extended or adjusted under 35 U.S.C. 154(b) by 78 days.

(21) Appl. No.: 17/116,815

(22) Filed: Dec. 9, 2020

(65) Prior Publication Data

US 2021/0334500 A1 Oct. 28, 2021

(30) Foreign Application Priority Data

Apr. 22, 2020 (CN) .......................... 202010323374.2

(51) Int. Cl.
| | |
|---|---|
| *G06V 40/13* | (2022.01) |
| *H01L 27/15* | (2006.01) |
| *H01L 27/32* | (2006.01) |
| *G06V 10/145* | (2022.01) |
| *H01L 27/146* | (2006.01) |

(52) U.S. Cl.
CPC ........ *G06V 40/1318* (2022.01); *G06V 10/145* (2022.01); *H01L 27/156* (2013.01); *H01L 27/3234* (2013.01); *H01L 27/3246* (2013.01); *H01L 27/14627* (2013.01); *H01L 27/14629* (2013.01); *H01L 27/14678* (2013.01)

(58) Field of Classification Search
CPC .. G06V 40/1318; G06K 9/0004; G06F 3/042; H01L 27/3234; H01L 27/3227; H01L 27/14627; G02B 3/0056
See application file for complete search history.

(56) References Cited

U.S. PATENT DOCUMENTS

| | | | | |
|---|---|---|---|---|
| 2017/0286743 | A1* | 10/2017 | Lee | G06V 40/1318 |
| 2019/0354789 | A1* | 11/2019 | Gu | G06V 10/145 |
| 2020/0116836 | A1* | 4/2020 | Pacala | G01J 3/2823 |
| 2021/0296409 | A1* | 9/2021 | Yamazaki | H01L 51/424 |
| 2022/0039697 | A1* | 2/2022 | Higano | G02F 1/13338 |

* cited by examiner

*Primary Examiner* — Yuzhen Shen
(74) *Attorney, Agent, or Firm* — Wolf, Greenfield & Sacks, P.C.

(57) ABSTRACT

The present disclosure discloses a display and input apparatus, including a display panel and an image sensor module. The display panel includes a display substrate, a display array, and a cover plate; a display pixel includes at least two types of sub-pixels that emit lights of different colors; a slit is disposed between pixel electrodes of two adjacent sub-pixels; in the display array, a pixel definition layer is disposed along the slit, and a plano-concave lens array is disposed along the pixel definition layer; each of the plano-concave lenses has its optical axis perpendicular to the display panel and passing through the center of the slit; and during image sensing, the display pixel emits light and illuminates an imaging object on the cover plate, and the image sensor module acquires a reflected image from a surface of the imaging object.

14 Claims, 13 Drawing Sheets

φ

θ          θ1

DISPLAY AND INPUT APPARATUS

CROSS-REFERENCE TO RELATED APPLICATIONS

The present application is based upon and claims the benefit of priority of Chinese Patent Application No. 202010323374.2, filed on Apr. 22, 2020, the entire contents of which are incorporated herein by reference.

TECHNICAL FIELD

Embodiments of the present disclosure relate to display technologies, and in particular, to a display and input apparatus.

BACKGROUND

With the expansion of application market of mobile terminals, more functions are expanded in a display of a mobile terminal. The display is integrated with a touch panel to implement touch and display functions, and is integrated with a fingerprint sensor to implement a fingerprint identification function. The fingerprint sensor is essentially a flat panel structure, and so does the display used for a mobile communication terminal. Therefore the fingerprint sensor and the display panel can be laminated together, to function as an image apparatus combining a display panel and an imaging sensor module.

In the prior art, in addition to light reflected from fingerprint ridges and valleys right above the fingerprint sensor, the fingerprint sensor also receives large-angle light from other fingerprint areas, causing blurring of an acquired fingerprint image.

SUMMARY

Embodiments of the present disclosure provide a display and input apparatus to improve resolution of a fingerprint image.

An embodiment of the present disclosure provides a display and input apparatus, comprising: a display panel, the display panel comprising a display substrate, and a display array that is formed by a plurality of display pixels and covers a side of the display substrate; the display pixel comprising at least two types of sub-pixels that emit lights of different colors; the sub-pixel comprising a pixel electrode, and a slit being disposed between the pixel electrodes of two adjacent sub-pixels; in the display array, a pixel definition layer completely covering the slit being disposed along the slit, and a plano-concave lens array being disposed along the pixel definition layer; each of the plano-concave lenses having an optical axis perpendicular to the display panel and passing through the center of the slit; and an image sensor module, the image sensor module covering a side of the display substrate facing away from the display array, and the image sensor module comprising a sensor array formed by a plurality of photosensitive pixels; where the display panel further comprises a transparent cover plate, an inner surface of the cover plate covering the display array; and during image sensing, the display pixel emits light and illuminates an imaging object on the cover plate, and the image sensor module acquires a reflected image from a surface of the imaging object.

The plano-concave lens array disposed at the pixel definition layer imposes a restriction on the reflected light, so that only reflected light at an angle smaller than a specific angle is guided to the image sensor module through the plano-concave lens array. In this way, large-angle reflected light is suppressed, and the resolution of the reflected image from the surface of the imaging object is improved.

BRIEF DESCRIPTION OF DRAWINGS

To describe the technical solutions in the embodiments of the present disclosure or in the prior art more clearly, the following outlines the accompanying drawings for illustrating such technical solutions. Apparently, the accompanying drawings outlined below are some embodiments of the present disclosure, and those skilled in the art can derive other structures and drawings based on the basic concepts of the device structure, the driving method, and the manufacturing method disclosed and suggested in various embodiments of the present disclosure, and such structures and drawings shall fall within the scope of the claims of the present disclosure.

DETAILED DESCRIPTION

To better and easily understand the present disclosure, the following clearly and comprehensively describes the technical solutions of the present disclosure with reference to specific implementations and the accompanying drawings in the embodiments of the present disclosure. Apparently, the described embodiments are merely some but not all of the embodiments of the present disclosure. All other embodiments obtained by those skilled in the art based on the basic concepts disclosed and suggested in the embodiments of the present disclosure shall fall within the protection scope of the present disclosure.

Figure 1:
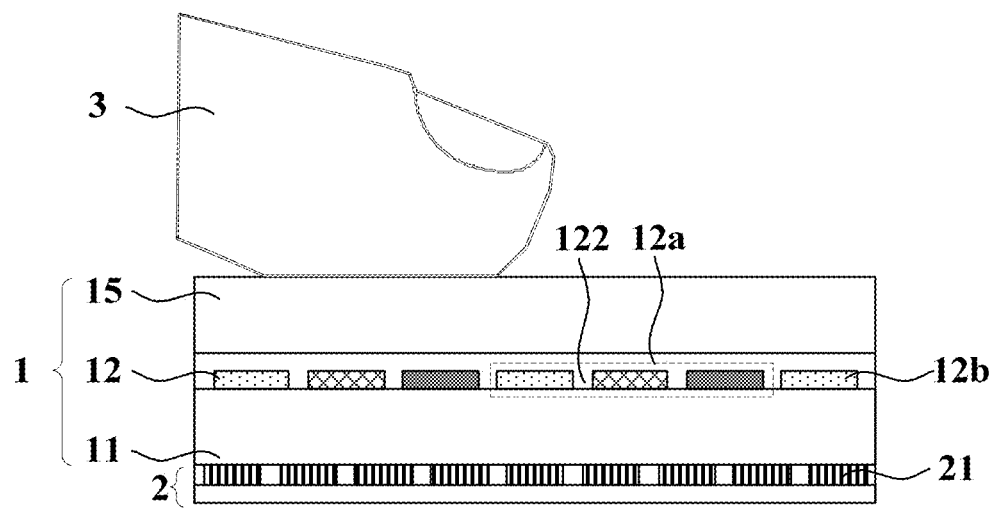
FIG. 1 illustrates a schematic diagram of a display and input apparatus according to an embodiment of the present disclosure.
Figure 2:
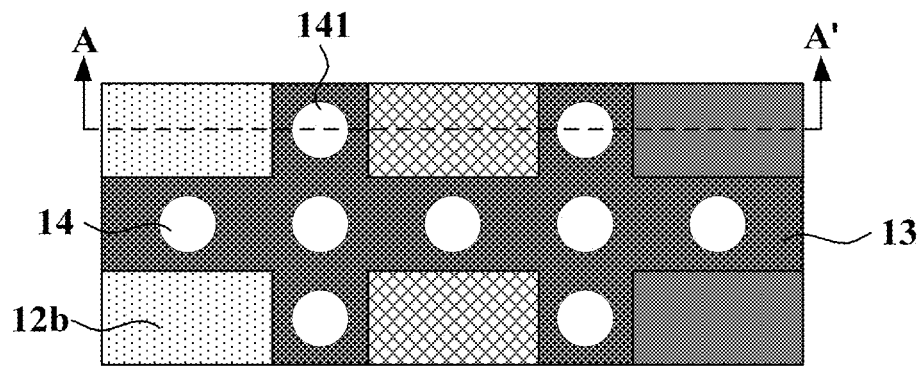
FIG. 2 illustrates a plane view of a closeup of the display shown in FIG. 1.
Figure 3:
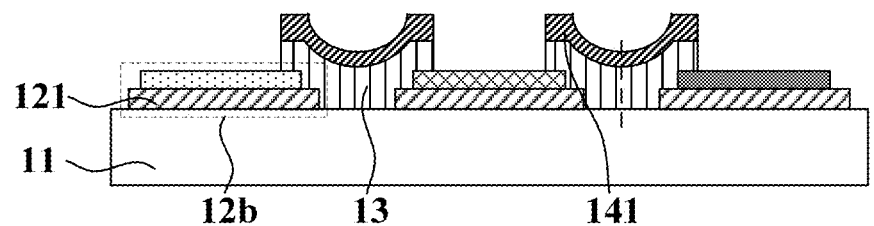
FIG. 3 illustrates a sectional view along A-A' section as shown in FIG. 2.

FIG. 1 illustrates a schematic diagram of a display and input apparatus according to an embodiment of the present disclosure. FIG. 2 illustrates a plane view of a closeup of the display shown in FIG. 1. FIG. 3 illustrates a sectional view along A-A' section as shown in FIG. 2. The display and input apparatus provided in the embodiment includes: a display panel 1, where the display panel 1 includes a display substrate 11, and a display array 12 that is formed by a plurality of display pixels 12a and covers a side of the display substrate 11; the display pixel 12a includes at least two types of sub-pixels 12b that emit lights of different colors; the sub-pixel 12b includes a pixel electrode 121, and a slit 122 is disposed between the pixel electrodes 121 of two adjacent sub-pixels 12b; in the display array 12, a pixel definition layer 13 completely covering the slit 122 is disposed along the slit 122, and a plano-concave lens array 14 is disposed along the pixel definition layer 13; each of the plano-concave lenses 141 has its optical axis perpendicular to the display panel 1 and passing through the center of the slit 122; and an image sensor module 2, where the image sensor module 2 covers a side of the display substrate 11 facing away from the display array 12, and the image sensor module 2 includes a sensor array formed by a plurality of photosensitive pixels 21; where the display panel 1 further includes a transparent cover plate 15, where an inner surface of the cover plate covers the display array 12; and during image sensing, the display pixel 12a emits light and illuminates an imaging object 3 on the cover plate 15, and the image sensor module 2 acquires a reflected image from a surface of the imaging object 13.

Various compatible display devices can be integrated with the image sensor module, such as an organic light-emitting display (OLED), or a Quantum Dot LED Display (QLED Display). In addition, both the display device and image sensor module can be made on a flexible substrate instead of a rigid substrate.

The display pixel 12a includes at least two types of sub-pixels 12b that emit lights of different colors. Optionally, the display pixel 12a includes a sub-pixel that emits red (R) light, a sub-pixel that emits green (G) light, and a sub-pixel that emits blue (B) light. In another embodiment, the display pixel includes two or more sub-pixels of different colors. For example, the display pixel includes a sub-pixel that emits red light and a sub-pixel that emits green light. The number of colors in the display pixel and the number of sub-pixels of each color are not limited in the present disclosure. For instance, the display pixel may include RGB three primary color sub-pixels, or may include a sub-pixel emitting white light or infrared light.

In the embodiment, the sub-pixel 12b comprises a sub-pixel electrode 121, and the slit 122 is formed between two adjacent sub-pixel electrodes, so that electrical isolation between the two adjacent sub-pixels is realized. In the display array 12, a pixel definition layer 13 completely covering the slit 122 is disposed along the slit 122. The pixel definition layer 13 includes a plurality of openings, exposing a portion of the sub-pixel electrode, forming the smallest lighting element in the display panel. The display array 12 further includes a plano-concave lens array 14 disposed at the pixel definition layer 13. The plano-concave lens array 14 comprises a plurality of plano-concave lenses 141, and each of the plano-concave lenses 141 has its optical axis perpendicular to the display panel 1 and passing through the center of the slit 122. The plano-concave lens 141 imposes a restriction on the angle of the light coming back from the transparent cover plate, so that only those light traces with an angle smaller than a specific angle can enter the image sensor. As a benefit from this arrangement, large-angle light is suppressed, and therefore resolution of the object image acquired by the image sensor is improved.

In the embodiment, the image sensor module 2 and the display array 12 are respectively laminated on the opposite surfaces of the display substrate 11. The image sensor module 2 includes a sensor array formed by a plurality of photosensitive pixels 21. The photosensitive pixels in the sensor array include amorphous silicon photodiodes or crystalline silicon photodiodes. In operation, a photoelectric signal is generated by reflected photons in the photosensitive pixel. The object image is obtained by scanning each photosensitive pixel 21 and reading out the photoelectric signal accordingly.

Typically, the imaging object 3 is a fingerprint or a document, which are in direct contact with an external surface of the cover plate 15. The imaging object 3 is irradiated by the display array, and then the image sensor module 2 acquires a reflected optical image from a surface of the imaging object through the plano-concave lens array 14 and the slits.

More specifically, assume that the imaging object 3 is a fingerprint which normally exhibits a ridge-valley surface topography. When the light photons impinge a ridge of the fingerprint, light photons tend to penetrate into the finger skin, resulting from less discrepancy in refractive indexes at an interface of the cover plate and the finger skin. When the light photons impinge a valley of the fingerprint, a large portion of the light photons tend to be reflected at the interface of the cover plate and a tiny air pocket, resulting from relatively large discrepancy in refractive indexes. Finally, the object image acquired by the image sensor module 2 exhibits bright-dark alternative strips.

On the other hand, when the imaging object 3 is a paper document, it contains a text or graphic pattern with lower reflectivity and blank area with higher reflectivity. Finally, the object image acquired by the image sensor module 2 exhibits a black-white pattern corresponding to the reflectivity distribution on the surface of the paper document.

Figure 4:
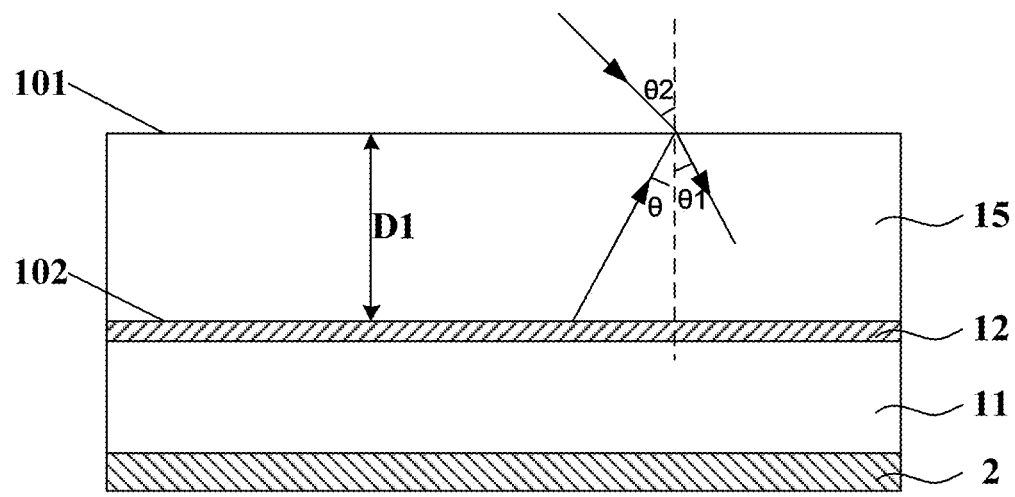
FIG. 4 illustrates a schematic diagram of under-screen fingerprint detection according to an embodiment of the present disclosure.

FIG. 4 illustrates a schematic diagram of under-screen fingerprint detection of a display and input apparatus. As the word "under-screen" suggests, the display is a top emission OLED structure, that light from the display array 12 is emitted upward, and the image sensor is positioned under the display panel. The OLED is generally a Lambertian light source that exhibits equal brightness in any direction. Luminous flux from a Lambertian light surface generally satisfies a relationship: $\varphi_{out}=\varphi_o \cdot \cos(\theta)$, wherein $\varphi_{out}$ denotes luminous flux in angle $\theta$ respect to a normal direction of the Lambertian light surface, $\varphi_o$ denotes luminous flux in normal angle respect to the Lambertian light surface.

Referring to FIG. 4, the luminous flux going back to the display from the surface reflection at a valley position of the fingerprint can be calculated using the following formula:

$$\varphi_{in} = \varphi_0 \cdot \cos\theta \cdot \left[ \frac{\sin^2(\theta_1 - \theta_2)}{\sin^2(\theta_1 + \theta_2)} + \frac{\tan^2(\theta_1 - \theta_2)}{\tan^2(\theta_1 + \theta_2)} \right].$$

Assume that n1 is the refractive index of the glass cover plate, which is approximately equal to 1.4, n2 is the refractive index of the air, which is approximately equal to 1, according to Fresnel refraction law, $n_1 \cdot \sin(\theta_1) = n_2 \cdot \sin(\theta_2)$.

Then, the light emitted from a light spot (that is, a sub-pixel 12b) is reflected by the cover plate 15, and returns to a position with a distance of R from the light point, where $R = 2 \cdot D1 \cdot \tan(\theta_1)$, where D1 denotes the thickness of the cover plate.

Figure 5:
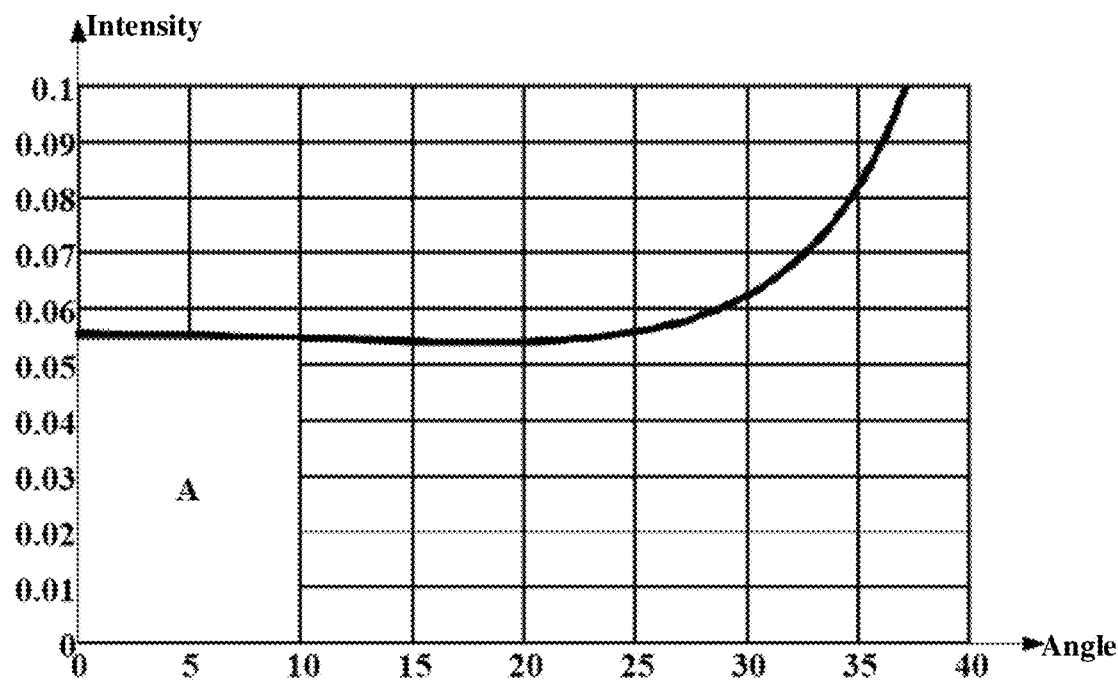
FIG. 5 illustrates light intensity distribution of reflected light.

In the first order approximation, assume $\theta = \theta_1$, then $\varphi_{in}$ is calculated for $\theta_1$ as variable. The calculation result is plotted in FIG. 5, the horizontal axis represents the reflection angle of the reflected light $\theta_1$, and the vertical axis represents the light intensity of the reflected light $\varphi_{in}$.

The calculated curve indicates that the intensity of the reflected light rises sharply when the reflection angle is approaching a total reflection angle (in this case, 43 degrees). The large-angle reflected light is not originated from the fingerprint right above the OLED lighting surface 102, but is originated from other distant fingerprints. As can be seen from the optical path shown in FIG. 4, the thicker the cover plate 15 is, the farther the large-angle reflected light is originated from. Given the thickness of the cover plate, which is in same order of magnitude as a fingerprint ridge width or even larger, the cover plate might be the primary root cause of blurred fingerprint image.

As a benefit from the plano-concave lens and the slit combination, only those reflected light at an angle smaller than a specific angle is guided to the image sensor module 2. Assume the specific angle is 10 degrees, then a maximum viewing angle from OLED light surface is 20 degrees, that any reflected light or scattering light beyond this viewing angle are unable to reach the image sensor behind the display substrate. Object image acquired by the image sensor is improved accordingly.

As the angle dependent light intensity curve indicated, when light angle is smaller than 10 degrees, as marked by a region A, the light intensity of the reflected light is kept about 5.5% and essentially independent on the light angle. Assume a vertical distance D1 of 500 microns from the OLED lighting surface to the external surface of the cover plate 15, then 20 degrees viewing angle from the slit corresponds to a 180 micron-wide region on the external surface of the cover plate, that is, R=2*500*tan 10≈180.

Figure 6:
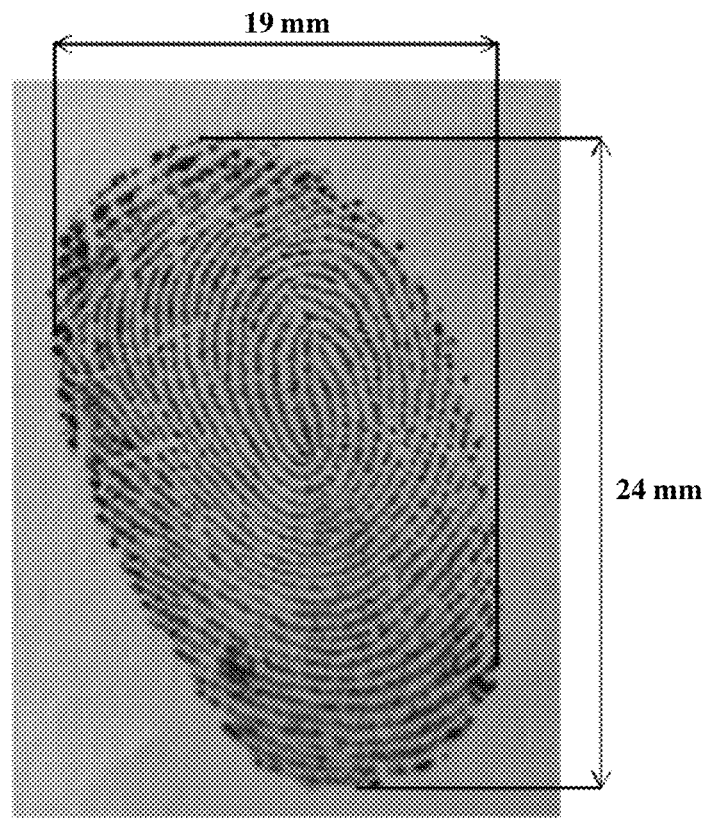
FIG. 6 illustrates a fingerprint picture.

FIG. 6 illustrates a fingerprint image measured on a male adult finger. A ridge-valley period is approximate 525 microns, which is approximately 2.9 times the width R corresponding to the 20 degree viewing angle. When the spacing between the sub-pixels of the display array, i.e. a repeating pitch of the slits, is less than 263 microns, according to Nyquist sampling theory, it is feasible to restore a fingerprint image that exhibits bright-dark strips. In other words, half of the ridge-valley period is considered as the minimum sampling period of the fingerprint image. Consider ridge-valley dimension varies with age and race, the maximum sampling distance LM for the fingerprint image should be approximately 200 microns, which is suitable for most people, and is larger than sub-pixel pitch in most smart phone display.

As shown in FIG. 2, the plano-concave lens 141 is a circular plano-concave lens, characterized by a hemispherical concave on one side and a flat surface on the opposite of the lens. The plano-concave lens array 14 includes a plurality of the circular plano-concave lenses. At least one plano-concave lens 141 is evenly disposed between two adjacent pixel electrodes and at the pixel definition layer 13. Those skilled in the art can set a proper distribution density of the plano-concave lenses in the plano-concave lens array based on the product requirements. In the embodiment, a plurality of circular concave lenses are disposed along the slits in longitudinal and transverse directions. It is anticipated that the slits in the longitudinal or transverse directions may have different widths, and therefore the plano-concave lenses may have different diameters and curvature radiuses accordingly.

Figure 7:
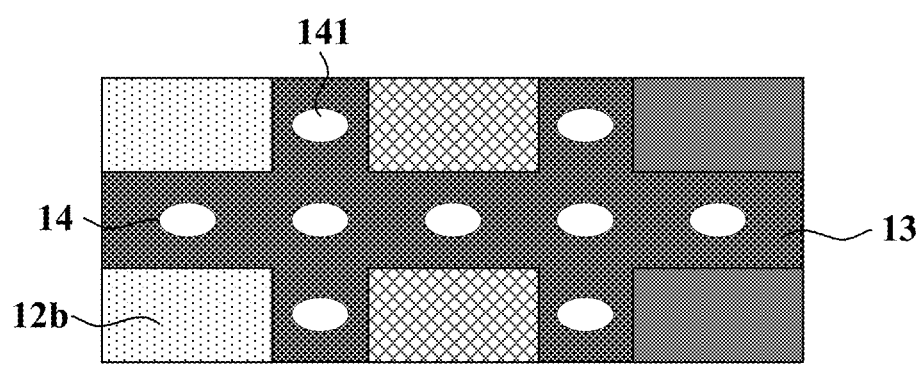
FIG. 7 illustrates a plane view of a closeup of a display array according to an embodiment of the present disclosure.

As shown in FIG. 7, the plano-concave lens 141 is an elliptical plano-concave lens, that is, the plano-concave lens 141 has a semi-ellipsoid concave. Then, the plano-concave lens array 14 includes a plurality of elliptical plano-concave lenses independent of each other. At least one plano-concave lens 141 is evenly disposed at the pixel definition layer 13 between two adjacent pixel electrodes. Those skilled in the art can set a proper distribution density of the plano-concave lenses in the plano-concave lens array based on the product requirements.

Figure 8:
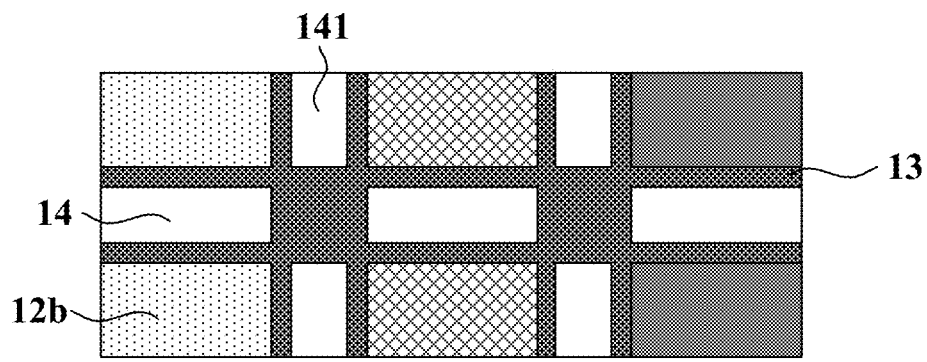
FIG. 8 illustrates a plane view of a closeup of a display array according to an embodiment of the present disclosure.

As shown in FIG. 8, the plano-concave lens 141 is a cylindrical plano-concave lens, that is, the plano-concave lens 141 has a semi-cylindrical concave. The plano-concave lens array 14 includes a plurality of cylindrical plano-concave lenses independent of each other. At least one plano-concave lens 141 is evenly disposed at the pixel definition layer 13 between two adjacent pixel electrodes. Those skilled in the art can set a proper distribution density of the plano-concave lenses in the plano-concave lens array based on the product requirements.

Figure 9:
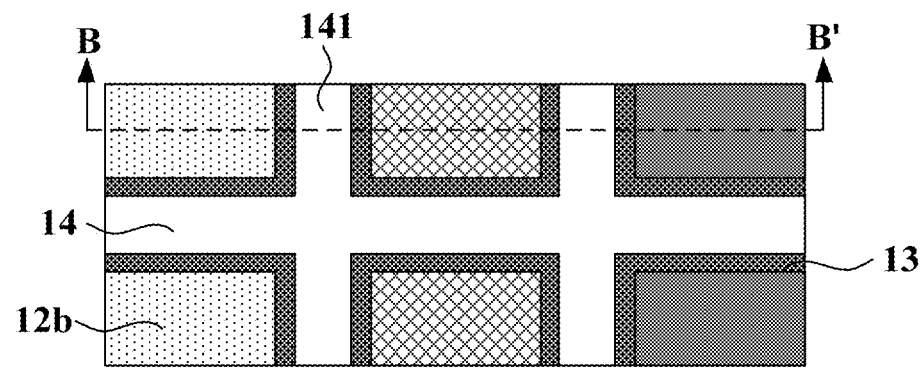
FIG. 9 illustrates a plane view of a closeup of a display array according to an embodiment of the present disclosure.

As shown in FIG. 9, the plano-concave lens array 14 includes a plurality of cylindrical plano-concave lenses, and the cylindrical plano-concave lenses are connected together along the pixel definition layer 13. A cross sectional view along B-B' can be expressed by FIG. 3. The transverse and longitudinal slits in the display array may have different widths, and correspondingly, transverse and longitudinal cylindrical concave lenses may have different dimensions.

In another embodiment, the plano-concave lens array may be formed by lenses in various geometric shapes, including but not limited to a cylindrical plano-concave lens, a circular plano-concave lens, and an elliptical plano-concave lens.

Figure 10:
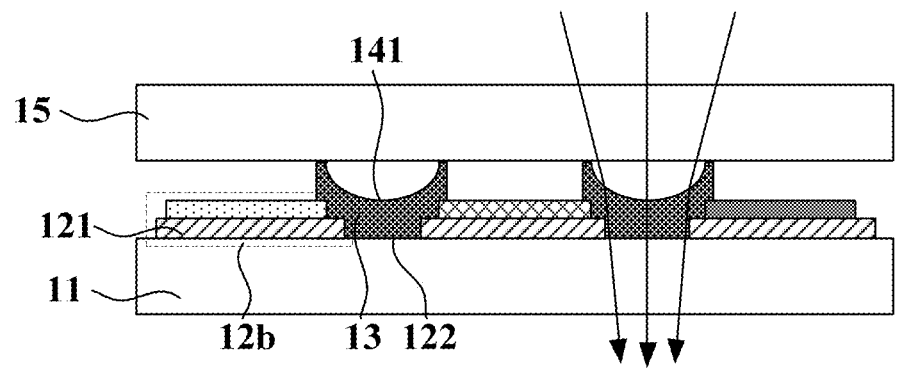
FIG. 10 illustrates a schematic diagram of a display panel according to an embodiment of the present disclosure.

Some structural details of the foregoing technical solution are shown in FIG. 10. The plano-concave lens 141 is disposed at the pixel definition layer 13, the concave of the plano-concave lens 141 faces the cover plate 15, and the edge of the plano-concave lens 141 is connected to the inner surface of the cover plate 15 so as to define an interstice from the cover plate 15 to the display array 12.

In the embodiment, each of the plano-concave lenses 141 has its optical axis perpendicular to the display panel and passing through the center of the slit 122. The plano-concave lens 141 sitting on the slit 122 collects light beams that are converging to the plano-concave lens, and guides them to the image sensor module. Therefore the resolution of the object image is improved.

Instead of adding the plano-concave lens on the pixel definition layer (PDL hereinafter), forming the plano-concave lens by directly patterning the PDL can simplify the manufacture process and therefore reduce costs. In addition, as described herein, since the peripheral of the plano-concave lens is in contact with the cover plate inner surface, the plano-concave lens serves as a spacer to hold the cover plate as well. The plano-concave lens may be made of photosensitive resin to avoid using photoresist, and may be surface coated with an anti-reflection film to increase light transmission.

Figure 11:
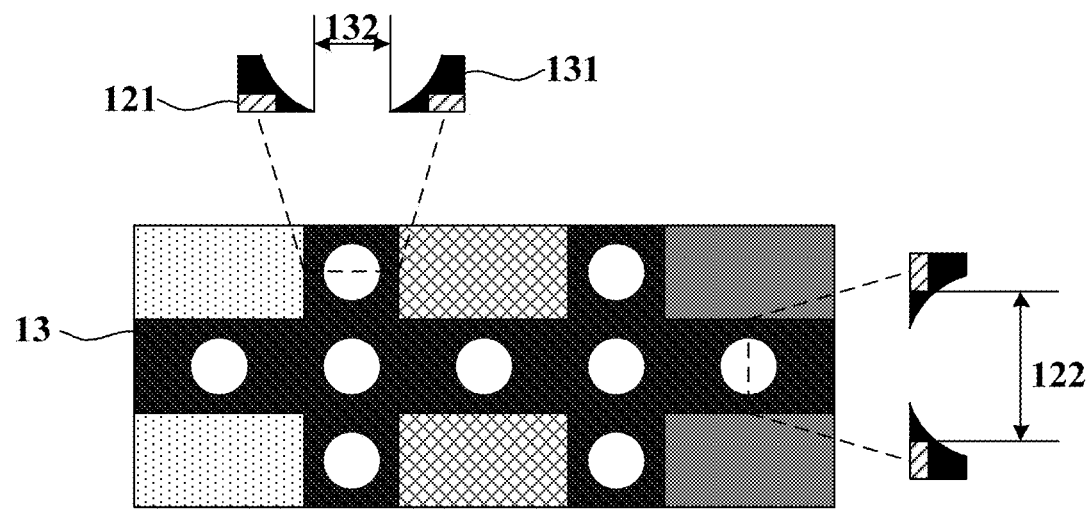
FIG. 11 illustrates a schematic diagram of a pixel definition layer according to an embodiment of the present disclosure.
Figure 12:
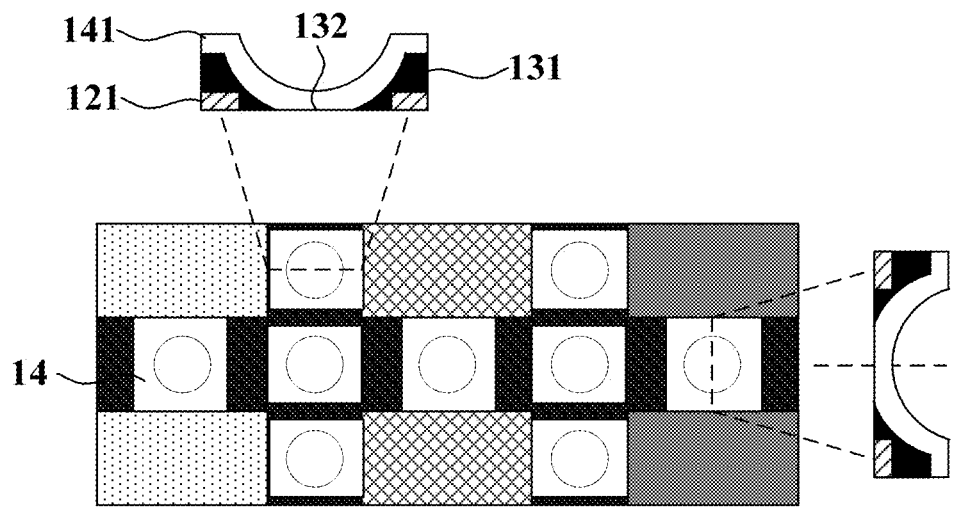
FIG. 12 illustrates a plane view of a closeup of a display array according to an embodiment of the present disclosure.

Another embodiment is shown in FIG. 11 and FIG. 12, wherein the pixel definition layer 13 includes a light-opaque black layer 131 which has a through-hole 132, and the center of the through-hole 132 coincides with the optical axis of the plano-concave lens 141.

As shown in FIG. 11, the black layer 131 is a strip-like shape covering the slit 122, and the black layer 131 includes a plurality of through-holes 132. As shown in FIG. 12, the plano-concave lens array 14 is formed at the black layer 131, and the black layer 131 conforms to the concave surface of the plano-concave lens 141. The optical axis of the plano-concave lens passes through the center of the slit and the center of the through-hole 132.

The black layer is called black matrix as well, which prevents optical cross-talk between adjacent sub-pixels. In addition, the black matrix with the through holes, combing with the plano-concave lenses, will prevent light beams in large oblique angle from entering into the image sensor module, so that the resolution of the object image is improved.

Figure 13:
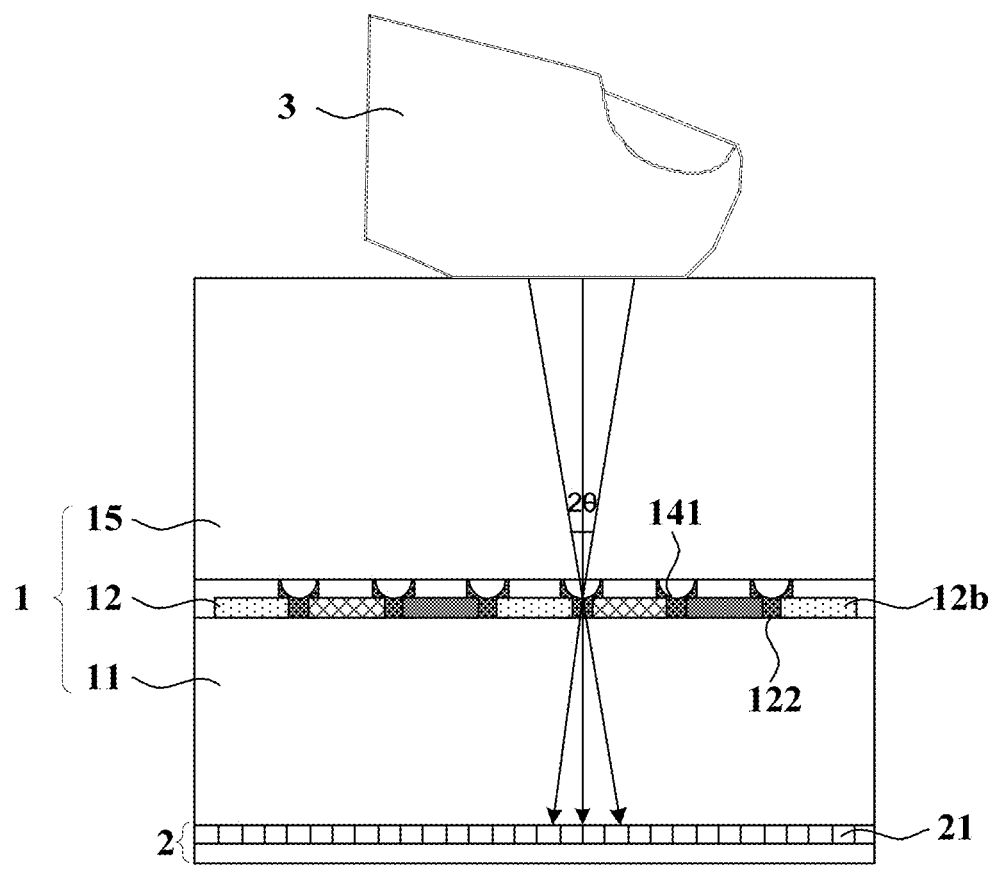
FIG. 13 illustrates a schematic diagram of a display and input apparatus according to an embodiment of the present disclosure.

As shown in FIG. 13, the plano-concave lens 141 and the light through-hole 132 act together so that reflected light from the imaging object with an angle smaller than θ passes through the through-hole 131 and enters the image sensor module 2. Angle θ satisfies a formula: $0.5 \tan^{-1}(Pd/D1) \leq 2\theta \leq 2 \tan^{-1}(Pd/D1)$. Pd denotes a size of the sub-pixel on the display array, and D1 denotes a vertical distance between the outer surface of the cover plate and the plano-concave lens array.

FIG. 13 illustrates a light path along which the reflected light of the imaging object 3 passes through the slit 122 between the pixel electrodes and falls onto the image sensor module 2. Each slit selectively allows some light beam from a certain region on the imaging object 3 to pass through. This process is referred to as a first spatial sampling of the imaging object by the slit 122, versus a second spatial sampling by image sensor pixel. A sampling region on the imaging object is defined by a solid angle 2θ looking up from the slit 122.

If slits 122 at adjacent or different positions acquire the reflected light from the same position on the outer surface of the cover plate 15, the reflected light enters a plurality of photosensitive pixels, causing cross-talk or blurring of the reflected image acquired by the image sensor module 2. If the reflected light from a position on the outer surface of the cover plate 15 is not acquired by a slit 122, details of the image of the imaging object are lost. Based on this, angle θ should satisfy a formula: $0.5 \tan^{-1}(Pd/D1) \leq 2\theta \leq 2 \tan^{-1}(Pd/D1)$. The display and input apparatus and the image sensor module in the display and input apparatus are designed and manufactured based on this formula, so that the slit 122 acquires the reflected light from a certain region of the outer surface of the cover plate 15. Edges of acquisition regions of adjacent slits 122 are adjacent, so that the cross-talk or blurring of the reflected image is alleviated, and details of the image of the imaging object are retained. Pd may be considered as an arrangement period of the sub-pixels in the display array, or may be considered as the spacing between center points of two adjacent sub-pixels.

A light-intensity spatial distribution of the light passing through the slit 122 may be acquired through convolution integral of a light intensity distribution limited within an angle and light through-holes of the slit. According to the convolution Fourier transform theorem, during the Fourier transform of the light intensity of the light passing through the slit 122, a spatial spectrum of the light passing through the slit 122 is determined by a product of the MTF of the reflected-light intensity evenly distributed within a certain angle and the MTF of the slit. The light passing through the slit 122 between electrodes needs to pass through the transparent glass substrate (the display substrate 11) with a certain thickness to reach the image sensor module 2 at the bottom of the display substrate 11. This is the second spatial sampling. During the second spatial sampling, the light maintains a propagation angle in the glass of the cover plate 15 and keeps diffusing in the manner of mirror-image reversal. Similar to the pinhole imaging principle, the image of the imaging object limited to some angles on the glass of the cover plate 15 is mirror-image reversed after passing through the slit 122. The image of the imaging object subjected to the mirror-image reversal is projected on the sensor array of the image sensor module 2, so that the reflected image is acquired, and the second image spatial sampling is completed.

Figure 14:
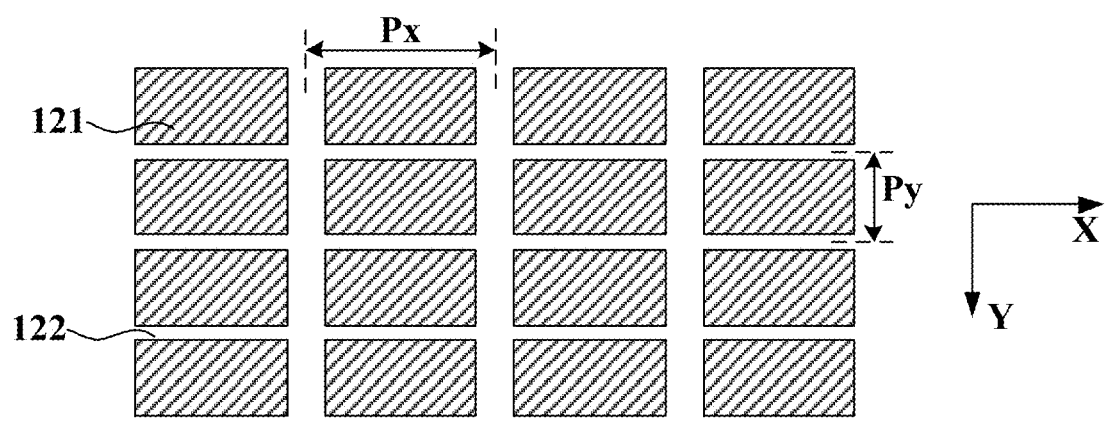
FIG. 14 illustrates a schematic diagram of a pixel electrode matrix of a display array.

During the first spatial sampling, the display pixels in the display array generally include RGB three primary color sub-pixels. A display pixel is generally a symmetrical square or hexagon. Then, a monochromatic sub-pixel may not have a symmetrical shape whose length and width are basically equal, but may be rectangular. Accordingly, the distance between slits between adjacent pixel electrodes may be different in different directions. FIG. 14 illustrates a pixel electrode matrix of a display array. A spacing Px between two adjacent slits 122 in the X direction is greater than a spacing Py between two adjacent slits 122 in the Y direction. Typically, Px is greater than 3×Py, so that a display pixel may include a structure with RGB three primary color sub-pixels identical in size and shape. A slit spacing may be considered as a sampling spacing.

Figure 15:
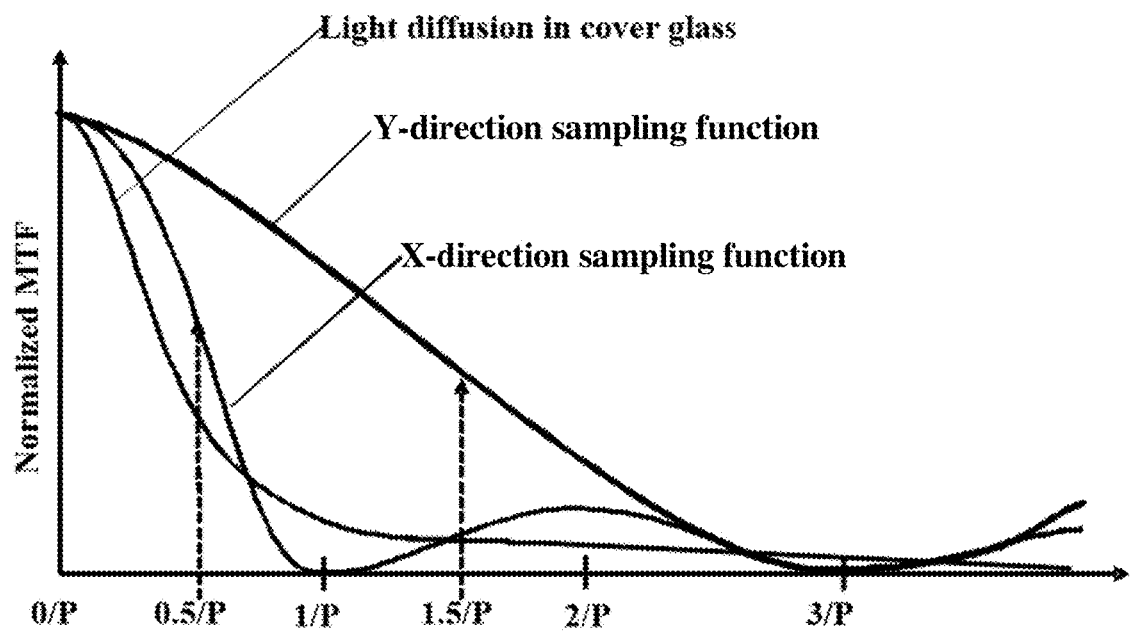
FIG. 15 illustrates Fourier transform of a display array structure having different slit spacings in different directions.

For a display array structure having different slit spacings in different directions, Fourier transform of the display array structure is shown in FIG. 15. The graph includes three MTF curves after the first diffusion of the image of the imaging object on the cover plate. The MTF curve may be a spectrum obtained after Fourier transform of the spatial region A in FIG. 5. The three MTF curves include an MFT curve of an X-direction sampling function, an MFT curve of a Y-direction sampling function, and an intensity distribution spectrum "Light diffusion in cover glass" of the reflected light from the outer surface of the cover plate after the light is diffused by the cover plate. The frequency at 0.5/P is a Nyquist frequency of X-direction sampling, and the frequency at 1.5/P is a Nyquist frequency of Y-direction sampling. According to the Nyquist sampling theorem, only image information with spatial frequencies lower than a Nyquist frequency can be restored. That is, a frequency interval formed between 0.5 P and 1.5 P in FIG. 15 is the maximum spatial frequency for reproducing the image of the imaging object. P denotes the width of one sub-pixel.

When slit spacings in the X direction and the Y direction are different, the effective light through solid angles 2θ in the X direction and the Y direction are also different. According to practical application, the manufacturing process and other factors, the different effective light through solid angles in the X direction and the Y direction are within a range limited by the foregoing formula: $0.5 \tan^{-1} (Pd/D1) \leq 2\theta \leq 2 \tan^{-1} (Pd/D1)$. However, in another embodiment, when slit spacings in the X direction and the Y direction are equal, $2\theta = \tan^{-1} (Pd/D1)$. Those skilled in the art can determine the effective light through solid angle based on product requirements.

Figure 16:
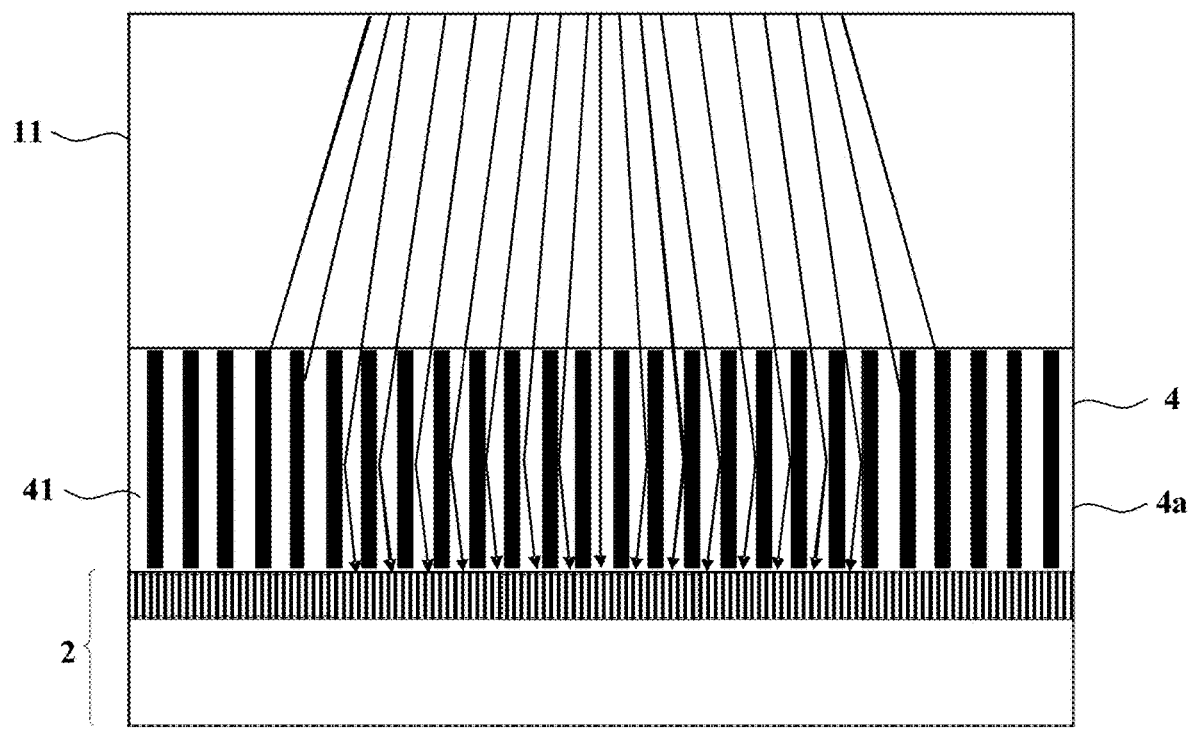
FIG. 16 illustrates a schematic diagram of a collimation structure.

As shown in FIG. 16, the display and input apparatus may further include a collimation structure 4 disposed between the display panel and the image sensor module 2. The collimation structure 4 includes at least one optical collimation layer 4a with a plurality of optical channels 41. The optical channels 41 are optical fibers or through-holes that penetrate through the optical collimation layer 4a, and the optical channels 41 are perpendicular to a plane in which the image sensor module 2 is located. The display panel includes the display substrate 11 and the display array. The image sensor module 2 and the display array are disposed on surfaces on two sides of the display substrate 11. The collimation structure 4 is disposed between the display panel and the image sensor module 2, which means that the collimation structure 4 is disposed between the image sensor module 2 and the display substrate 11 of the display panel. The plurality of optical channels 41 refer to at least two optical channels. Optionally, the optical collimation layer 4a is provided with a plurality of optical channels 41 that are evenly arranged.

The optical collimation layer 4a includes a light shielding region and a plurality of transparent regions. The transparent regions are optical channels 41 that allow light to pass. The light shielding region blocks and absorbs light. A black filler between two adjacent optical channels 41 is the light shielding region. Optionally, the optical channels 41 are optical fibers penetrating through the optical collimation layer 4a, and then, the light propagates through the optical fibers having high light transmittance and exits. Optionally, the optical channels 41 are through-holes penetrating through the optical collimation layer 4a, and then, the light propagates through the through-holes and exits. The optical channels 41 are perpendicular to the plane in which the image sensor module 2 is located, so that the optical channels 41 allow the reflected light that passes the slit and has an angle smaller than a specific angle to enter the image sensor module 2. In another embodiment, the collimation structure includes at least two optical collimation plates having a plurality of optical channels.

In the embodiment, by using the optical collimation layer 4a, the large-angle reflected light or light from the periphery of the display pixel is absorbed by the surface of the light shielding region at the optical collimation layer 4a or by inner walls of the optical channels, and only reflected light at a relatively small angle is guided to the image sensor module 2. In this way, the larger-angle reflected light is prevented from entering the image sensor module 2, and the resolution of the reflected image from the surface of the imaging object is greatly improved.

The foregoing description is the process of the second spatial sampling. The second spatial sampling or the second image sampling means that the light exits from the slit, passes through the collimation structure, and enters the image sensor module. Specifically, the reflected light is incident on a light receiving surface of the sensor array, and each photosensitive pixel in the sensor array receives reflected light at various angles. A layer of collimation structure covers the image sensor module, so as to avoid the cross-talk and blurring of the reflected image that is caused by the large-angle reflected light. The collimation structure may be formed by an optical fiber panel. The width of each optical fiber or each optical channel ranges between several microns and more than ten microns. A black filler or a reflective layer is disposed between the optical fibers or the optical channels. The collimation structure enables only the reflected light with an angle smaller than a certain incident angle to smoothly pass through the optical fibers or the optical channels to reach the photosensitive pixels.

Figure 17:
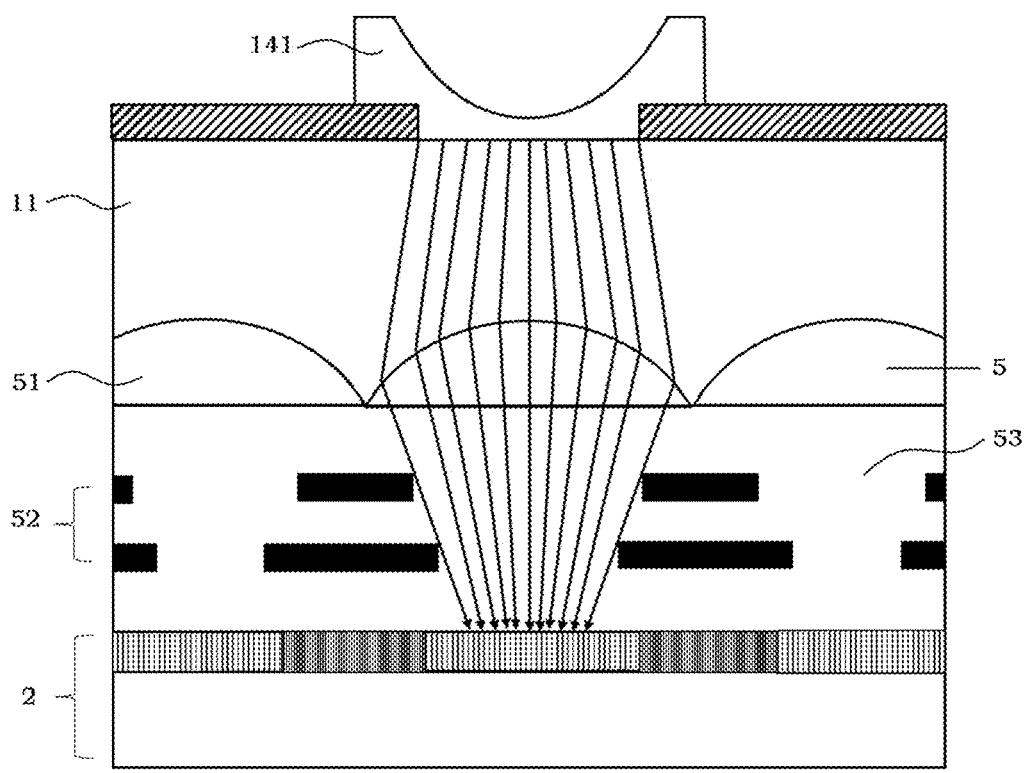
FIG. 17 illustrates a schematic diagram of light traces in a lens combination.

As shown in FIG. 17, the display and input apparatus may further include a convex lens array 5 that is disposed between the display panel and the image sensor module 2 and formed by a plurality of convex lenses 51. The optical axis of the convex lens 51 is parallel to the optical axis of the plano-concave lens 141.

The layer of collimation structure covers on the image sensor module, so as to avoid the cross-talk and blurring of the reflected image that is caused by the large-angle reflected light. The collimation structure includes an optical collimation layer. Typically, the optical collimation layer is an optical fiber panel. Reflected light losses certain energy after being reflected by the inner wall of an optical fiber for several times. An angle δ of light without such reflection losses approximately satisfies a formula: $\delta = \tan(Df/Lf)$. Df denotes a diameter of the through-hole of the optical fiber or the optical channel, and Lf denotes the length of the optical fiber, that is, the thickness of the optical collimation layer. For example, Df is 5 microns, Lf is 100 microns, and then, δ is about 2.9 degrees. The optical collimation layer can effectively isolate the large-angle reflected light to ensure the resolution of the reflected image from the surface of the imaging object. However, with respect to the foregoing field angle of 20 degrees, optical energy of an acquired optical signal is 15% less than the optical energy of the acquired optical signal without the collimation structure, resulting in a weak optical signal.

Based on this, in the embodiment, the convex lens array 5 is disposed between the display panel and the image sensor module 2 to reduce the optical energy loss while improving the resolution of the reflected image.

The display panel includes a display substrate 11. The convex lens array 5 is disposed between the display panel and the image sensor module 2, which means that the convex lens array 5 is disposed between the display substrate 11 of the display panel and the image sensor module 2. The plurality of convex lenses 51 include at least two convex lenses. Optionally, the convex lens 51 is an elliptical microlens, a circular microlens, or a cylindrical microlens. The convex lens 51 has a focusing function. Then, the plurality of convex lenses 51 are disposed between the display substrate 11 and the image sensor module 2, and the convex faces the cover plate, so that more reflected light transmitted from the slit can be focused and reach a surface of the image sensor module 2. Therefore, luminous flux is increased, and light acquisition efficiency is improved. Optionally, one photosensitive pixel in the image sensor module 2 corresponds to at least one focusing convex lens 51. Optionally, when no or only a few parts, materials, or processes are added, structural parameters of the convex lens, such as curvatures, dimensions, and a distribution density, are set based on the existing structures, materials, or processes of the apparatus, to enable the convex lenses to convert divergent light beams incident on the convex of the convex lenses into approximately parallel light beams, so that the convex lenses can focus most reflected light and improve the light acquisition efficiency, luminous flux, and focusing effect.

Optionally, as shown in FIG. 17, the convex lens array 5 further includes a light shielding layer 52. The light shielding layer 52 includes a plurality of apertures 53. The optical axis of the convex lens 51 passes through the center of the aperture 53. Optionally, the convex lens array 5 and the apertures 53 on the light shielding layer 52 are evenly distributed and cover the sensor array.

To further improve the light acquisition efficiency, as shown in FIG. 17, the convex lens array 5 uses a structure of microlens, that is, a plurality of convex lenses 51 and at least one light shielding layer 52. The light shielding layer 52 includes a plurality of apertures 53. For each photosensitive pixel of the sensor array in the image sensor module 2, optionally, n focusing convex lenses 51 are evenly distributed and cover the photosensitive pixel, m apertures 53 are evenly distributed and cover the photosensitive pixel, and m and n are positive integers. The microlens in the convex lens array 5 can focus the reflected light transmitted through the plano-concave lens 141 and the slit, so that the luminous flux is increased, and the light acquisition efficiency is improved. Then, the apertures 53 can filter out the large-angle focused reflected light, so as to block the large-angle reflected light and prevent the large-angle focused reflected light from entering the photosensitive pixel. Therefore, the resolution of the reflected image from the surface of the imaging object is improved.

The light shielding layer 52 includes a light shielding region and a plurality of transparent regions. The transparent regions are apertures 53 that allow light to pass. The light shielding region blocks and absorbs light. A black filler between two adjacent apertures 53 is the light shielding region. Optionally, the light shielding layer 52 is provided with two stacked aperture arrays. The upper aperture array facing the display substrate 11 has larger apertures, and the lower aperture array facing the image sensor module 2 has smaller apertures, so that the large-angle reflected light can be easily suppressed.

Optionally, the convex lenses 51 and the apertures 53 act together so that the light reflected from the imaging object at an angle smaller than θ passes through the apertures 53 and enters the image sensor module 2. Angle θ satisfies a formula: $0.5 \tan^{-1}(Pd/D1) \leq 2\theta \leq 2 \tan^{-1}(Pd/D1)$. Pd denotes the size of the sub-pixel on the display array, and D1 denotes the vertical distance between the outer surface of the cover plate and the plano-concave lens array.

As shown in FIG. 14, the reflected light of the imaging object 3 can pass through only the slit 122 between the pixel electrodes. A sampling region on the image of the imaging object corresponds to the position of the slit 122 and an effective light through solid angle 2θ looking up from the slit 122. The optical structure of the image sensor module may include the convex lens array on the photosensitive pixel and the apertures of the light shielding layer.

For example, if a size Ps of the photosensitive pixel is 50 microns and a thickness D2 of the display substrate 11 is 200 microns, this collimation structure formed by combining convex lenses and apertures can collect all reflected light within an angle within about 14.5 degrees. Compared with FIG. 16, the luminous flux can be increased by more than 5 times, so that the optical energy loss is reduced, and the resolution of the reflected image is improved.

Figure 18:
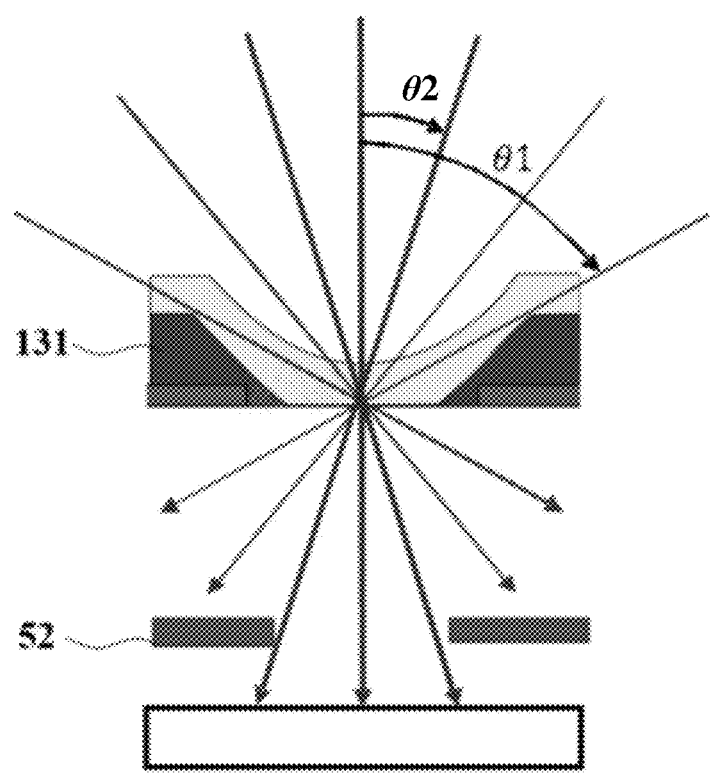
FIG. 18 illustrates an optical path of light reflected from a surface of an imaging object after passing through an aperture 1 and an aperture 2.
Figures 19, 20:
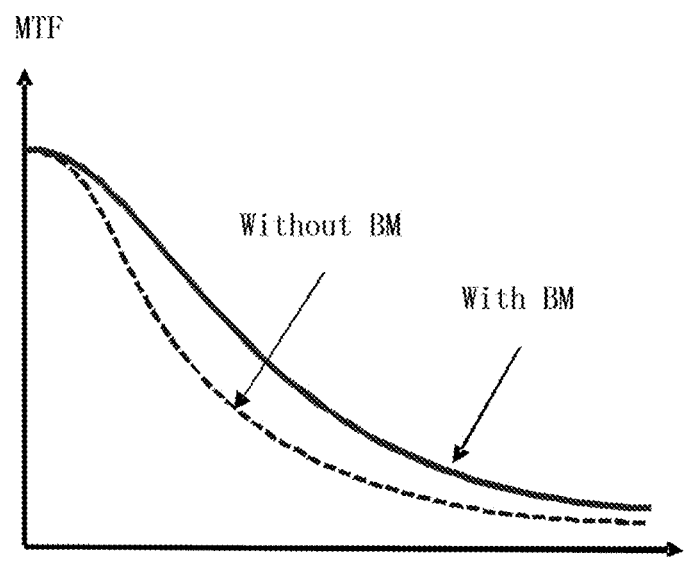
FIG. 19 illustrates a relationship between luminous flux and a maximum optical path angle.
FIG. 20 illustrates MTF curves before and after the aperture 1 and the aperture 2 are used.

Assume that the film layer 131 at the pixel definition layer is an aperture 1, and the light shielding layer 52 is an aperture 2. FIG. 18 illustrates the situation after the reflected light of the surface of the imaging object is limited by the aperture 1 and the aperture 2. FIG. 19 illustrates a relationship between luminous flux and a maximum optical path angle. FIG. 20 illustrates MTF curves before and after the aperture 1 and the aperture 2 are used. The angle of the reflected light can be limited to significantly improve the MTF of the image, so that the spatial resolution of the image is improved.

It should be noted that the pixel electrode of the sub-pixel is not necessarily a square, but may be a rectangle corresponding to RGB three primary color sub-pixels. Then, the effective light through solid angle is smaller in the direction along a narrower edge of the pixel electrode, and is larger in the direction along a wider edge of the pixel electrode. In this way, projections of the fingerprint image on the cover glass and penetrating through the spatial solid angle of the slit can cover an area as large as possible without excessive overlapping. A combination effect of the light through-holes in the slit and the aperture stops on the image sensor module determine an effective light through-hole or the effective light through solid angle. That is, when miniature convex lenses and aperture stops are disposed on the image sensor module, the convex lens and the aperture stops may be optimized to be elliptical, so as to correspond to different sizes in the length and width directions of a pixel while covering more of the fingerprint image on the cover glass, and further prevent images acquired by various optical elements from overlapping.

An angular magnification GW of the plano-concave lens should satisfy a formula: $GW \cdot D2/D1 < 1 \cdot D1$ denotes the vertical distance between the outer surface of the cover plate and the plano-concave lens array, and D2 denotes the vertical distance between the plano-concave lens array and the sensor array.

Figure 21:
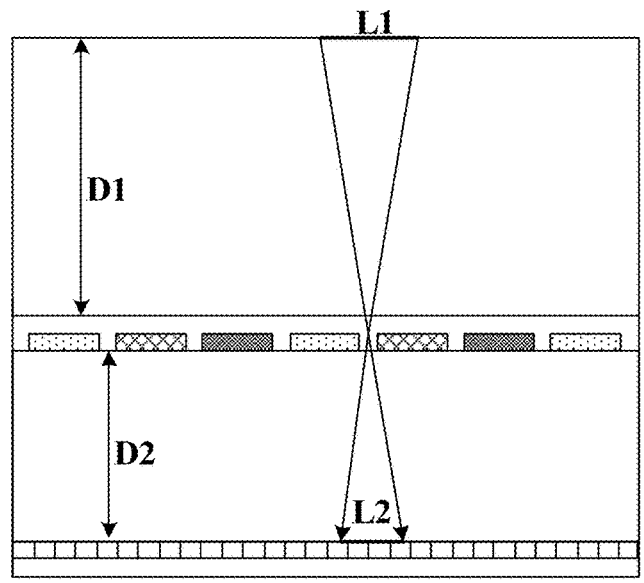
FIG. 21 illustrates a schematic diagram of a display and input apparatus without a plano-concave lens array on a slit.

FIG. 21 illustrates a schematic diagram of a display and input apparatus without a plano-concave lens array on a slit. In the display and input apparatus, according to the pinhole imaging principle, a fingerprint image with a length of L1 on the glass cover plate forms a mirror image with a length of L2 on the image sensor module. That is, $L2 = L1 \cdot D2/D1$. To prevent original images acquired by slits from overlapping on the image sensor module, that is, to avoid the case where L2<L1, D2 should be smaller than D1. That is, the vertical distance between the slit and the outer surface of the glass cover plate should be larger than the vertical distance between the slit and the image sensor module.

FIG. 14 illustrates a schematic diagram of a display and input apparatus with a plano-concave lens array on a slit. When a concave lens is used, an effective light through solid angle of light becomes smaller, so that the original images acquired by the slits do not overlap on the image sensor module. D2 is not necessarily smaller than D1. However, assume that the angular magnification of the plano-concave lens is GW (GW<1), to prevent the original images acquired by the slits from overlapping on the image sensor module, GW should satisfy a formula: $GW \cdot D2/D1 < 1$. Therefore, operators can have greater freedom when designing the positions and sizes of the display substrate, the cover glass, and the image sensor module of the display and input apparatus.

The size Ps of the photosensitive pixel should satisfy a formula: $Ps \leq GW \cdot LM \cdot D2/D1$. LM denotes an average width of the strip of the fingerprint or the minimum size of a to-be-identified character or graphic in the document, D1 denotes the vertical distance between the outer surface of the cover plate and the plano-concave lens array, D2 denotes the vertical distance between the plano-concave lens array and the sensor array, and GW denotes the angular magnification of the plano-concave lens.

As described above, after a fingerprint image with a geometric size of LM is sampled by the pixel slits and passes through the reduced solid angle of the plano-concave lens, the projection size of the fingerprint image on the image sensor module satisfies a formula: LMI=GW·LM·D2/D1. To ensure the resolution of the reflected image and prevent a photosensitive pixel on the image sensor module from receiving fingerprint image projections from two slits, the size Ps of the photosensitive pixel satisfies a formula: Ps≤GW·LM·D2/D1. Ps may be considered as an arrangement period of the photosensitive pixels in the sensor array, or may be considered as the spacing between center points of two adjacent photosensitive pixels.

The curved surface of the plano-concave lens is designed and manufactured as follows: The concave lens is disposed over the pixel electrode, one or more convex lenses are disposed on a side of each photosensitive pixel close to the incident light, and a corresponding aperture or light through-hole is disposed for each convex lens, so that the optical axis of the convex lens is perpendicular to the image sensor module and passes through the center of the aperture, and the convex lenses are arranged on a plane parallel to the image sensor module.

According to the display and input apparatus disposed based on the foregoing requirements, for an image whose width is half of the width of a fingerprint strip, an image whose width is less than or equal to the width of one photosensitive pixel is acquired by the image sensor module.

Figure 22:
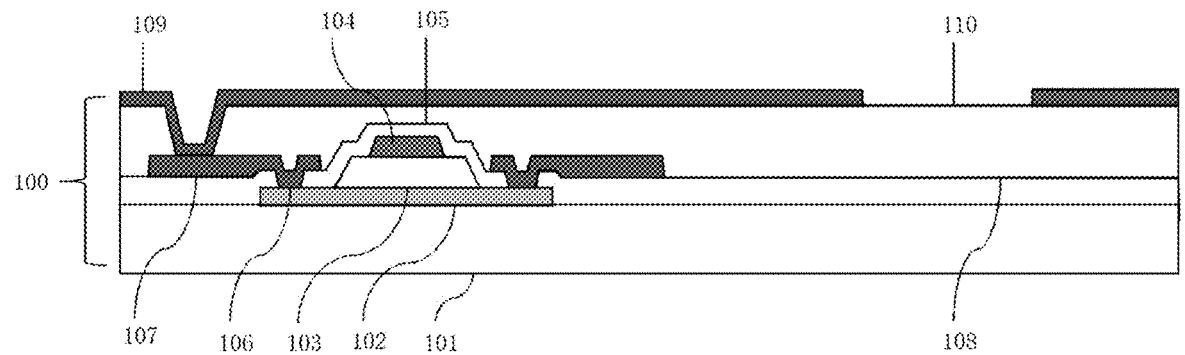
FIG. 22 to FIG. 27 illustrate flowcharts for manufacturing a display and input apparatus.

Based on the same inventive concept, an embodiment of the present disclosure further provides a method for manufacturing a display and input apparatus. Typically, the display and input apparatus is an OLED display. As shown in FIG. 22, the manufacturing method includes the steps described below.

S1. Provide a display substrate 101. The display substrate 101 is a glass substrate or another transparent substrate.

S2. Form a semiconductor film 102 on the display substrate 101. The semiconductor film 102 is used as an active layer of a thin film transistor. Typically, the semiconductor film 102 is a low temperature polysilicon film, an oxide semiconductor film, or the like.

S3. Form a gate insulating layer 103 of the thin film transistor on the semiconductor film 102. The gate insulating layer 103 is silicon oxide, silicon nitride, or a multilayer film of silicon oxide/silicon nitride.

S4. Form a gate electrode 104 of the thin film transistor on the gate insulating layer 103. The gate electrode 104 is made of a low temperature polysilicon material, molybdenum/copper/aluminum alloy, or the like.

S5. Form a passivation insulating film 105 for protecting the thin film transistor on the gate electrode 104. The passivation insulating film 105 may be silicon nitride, or a multilayer film of silicon nitride and silicon oxide.

S6. Open holes 106 in the passivation insulating film 105 to enable a source or drain electrode of the thin film transistor that is to be formed subsequently to contact with the semiconductor film 102.

S7. Form the source or drain electrode 107 of the thin film transistor. The source or drain electrode 107 may be made of molybdenum, copper, aluminum alloy, or the like.

S8. Form a planarization layer 108. The planarization layer 108 is configured to planarize a surface of a driving panel 100. Generally, an organic film is coated, and then, the planarization layer 108 is formed using methods such as high-temperature baking or UV curing.

S9. Form an anode conductive layer 109. The anode conductive layer 109 may be made of pure metal, or a transparent conductive film, or a composite multilayer film of a transparent conductive film and high-reflectivity metal. For example, the anode conductive layer 109 includes a transparent conductive film ITO and a high-reflectivity silver metal layer.

S10. Etch the anode conductive layer 109 to form independent pixel electrodes. A light-transmitting interstice, that is, a slit 110, is disposed between adjacent pixel electrodes.

Figure 23:
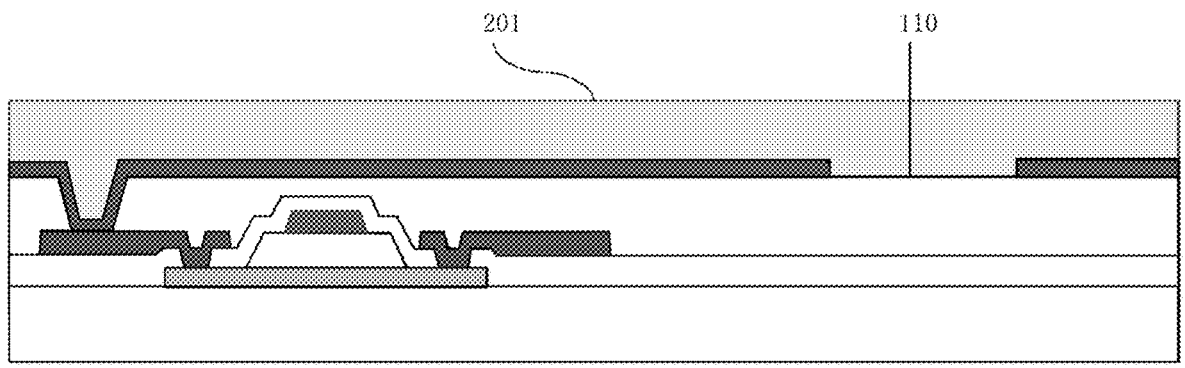

S11. As shown in FIG. 23, coat a liquid organic film 201 on the OLED driving panel 100, where the organic film 201 may be made of a photosensitive resin material. Then, the organic film 201 is pre-baked through UV curing or high-temperature baking to evaporate a solvent in the original organic film liquid.

Figure 24:
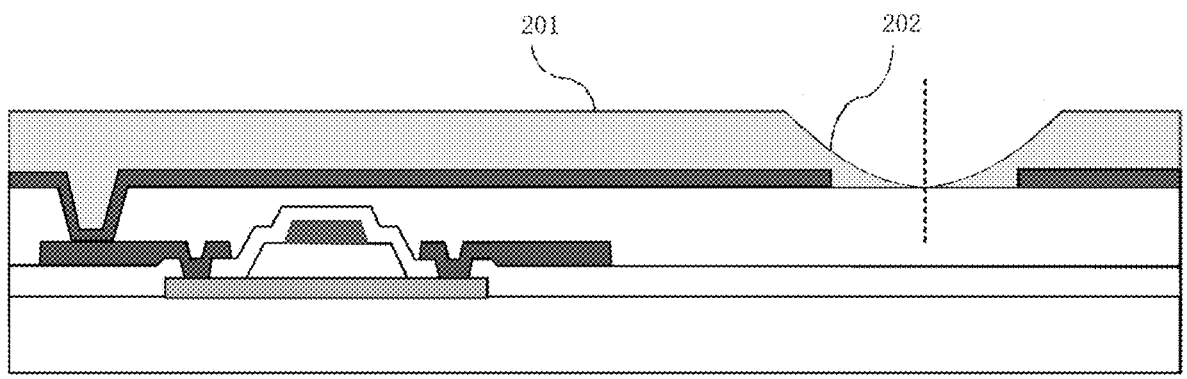

S12. As shown in FIG. 24, expose and etch the pre-baked organic film 201, and adjust etching parameters such as power of plasma and an oxygen percentage so that a funnel-shaped aperture 202 is etched at the position of the slit 110. The center of the etched aperture 202 may be completely etched through the organic film 201 without leaving any organic film material or leaving a quite thin film layer but larger than the wavelength of light.

Figure 25:
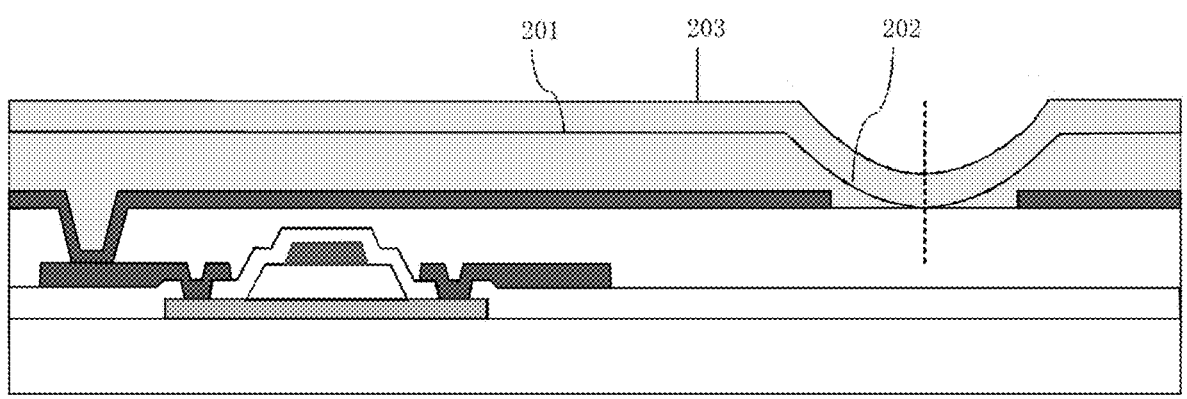

S13. As shown in FIG. 25, coat a second organic film 203, and select an organic film material with appropriate viscosity and process parameters so that the organic film 203 has a basically uniform thickness at a flat position and an aperture position, or the organic film 203 is slightly thinner at the flat position, and then, perform UV curing or high-temperature baking on the organic film 203.

Appropriate organic films 201 and 203 are selected so that optical refractive indexes satisfy the relationship: $n_{201} \geq n_{203}$. Therefore, the reflected light can be refracted at the interface between the organic film 201 and the organic film 203 to achieve a certain effect of a concave lens, so that a curvature radius of the concave lens can be designed with an additional degree of freedom to satisfy different process conditions. The organic films 201 and 203 both have higher transmittance to visible light.

Figure 26:
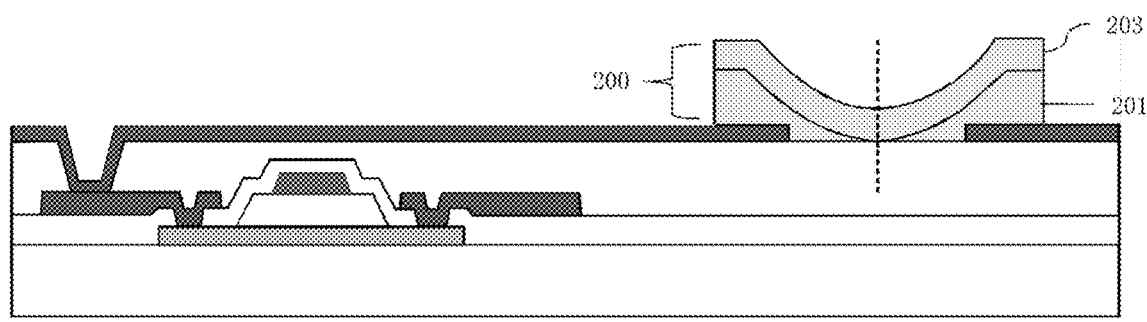

S14. As shown in FIG. 26, use the same photomask to etch the two organic films 201 and 203, and then perform high-temperature baking to make the surface of the concave lens 200 smoother.

To further increase the light transmittance, an anti-reflection (AR) layer may be coated before the concave lens 200 is etched, and then the three films are etched by using the same photomask.

Figure 27:
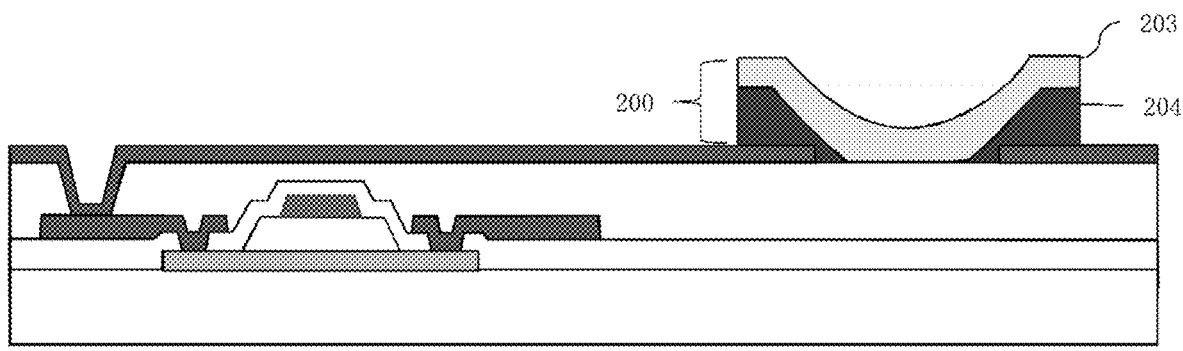

In another embodiment, the concave lenses may be manufactured by using the foregoing method. The difference is that as shown in FIG. 27, a first organic film 204 of the concave lens 200 is made of a light-opaque material that can shield large-angle light, and the black organic film 204 is disposed between adjacent concave lenses 200 to form a plurality of concave lenses 200. In another embodiment, no aperture is etched in the first organic film at positions of the slit and an interstice between adjacent concave lenses, so that a full thickness is retained to shield visible light.

It can be understood by those skilled in the art that the foregoing description is merely a flowchart for manufacturing an OLED display and input apparatus. In addition to the foregoing steps, the plano-concave lens array may be manufactured using other methods and processes.

The above detailed descriptions of the embodiments of the present disclosure set forth preferred modes contemplated by the inventors for carrying out the present disclosure at the time of filing this application, and are provided by way of examples and not as limitations. Accordingly, various modifications and variations obvious to a person of ordinary skill in the art to which it pertains are deemed to lie within the scope and spirit of the present disclosure as set forth in the following claims.

What is claimed is:

1. A display and input apparatus, comprising:
a display panel, the display panel comprising a display substrate, and a display array that is formed by a plurality of display pixels and covers a frontside of the display substrate; the display pixel comprising at least two types of sub-pixels that emit lights of different colors; the sub-pixel comprising a pixel electrode, and a slit being disposed between the pixel electrodes of two adjacent sub-pixels; the slit being completely covered by a pixel definition layer and a plano-concave lens array; each of the plano-concave lenses having its optical axis perpendicular to the display panel and passing through the center of the slit; and each of the plano-concave lenses having a cylindrical shape with its long axis in parallel with the slit;
the display panel further comprises a transparent cover plate covering the display array;
an image sensor module, comprising a sensor array formed by a plurality of photosensitive pixels, and covering a backside of the display substrate, wherein the image sensor module acquires a reflected light from the cover plate through the slit and the plano-concave lens array.

2. The display and input apparatus according to claim 1, wherein the imaging object is a fingerprint or a document, and the fingerprint or document is in close contact with an outer surface of the cover plate.

3. The display and input apparatus according to claim 1, wherein the plano-concave lens is fabricated at the pixel definition layer, a concave surface of the plano-concave lens faces the cover plate, an edge of the plano-concave lens is connected to an inner surface of the cover plate, and the concave surface of the plano-concave lens defines an interstice between the cover plate and the display array.

4. The display and input apparatus according to claim 1, wherein the pixel definition layer comprises a light-opaque black layer and a light through-hole at the black layer, and the center of the light through-hole coincides with an optical axis of the plano-concave lens.

5. The display and input apparatus according to claim 4, wherein the plano-concave lens and the light through-hole are configured to act together so that light reflected from the imaging object with an angle smaller than θ passes through the light through-hole and enters the image sensor module, the angle θ satisfying the following formula:

$0.5\ \tan^{-1}(Pd/D1) \le 2\theta \le 2\ \tan^{-1}(Pd/D1)$, wherein Pd denotes a size of the sub-pixel on the display array, and D1 denotes a vertical distance between the outer surface of the cover plate and the plano-concave lens array.

6. The display and input apparatus according to claim 1, further comprising a collimation structure disposed between the display panel and the image sensor module, the collimation structure comprising at least one optical collimation layer having a plurality of optical channels, the optical channels being optical fibers or through-holes that penetrate through the optical collimation layer, and the optical channels being perpendicular to a plane in which the image sensor module is located.

7. The display and input apparatus according to claim 1, further comprising a convex lens array that is disposed between the display panel and the image sensor module and formed by a plurality of convex lenses, an optical axis of the convex lens being parallel to the optical axis of the plano-concave lens.

8. The display and input apparatus according to claim 7, wherein the convex lens array further comprises a light shielding layer; and the light shielding layer comprises a plurality of apertures, and the optical axis of the convex lens passes through the center of the aperture.

9. The display and input apparatus according to claim 8, wherein
the convex lens and the aperture are configured to act together so that light reflected from the imaging object with an angle smaller than θ passes through the aperture and enters the image sensor module, the angle θ satisfying the following formula:

$0.5\ \tan^{-1}(Pd/D1) \le 2\theta \le 2\ \tan^{-1}(Pd/D1)$, wherein Pd denotes a size of the sub-pixel on the display array, and D1 denotes a vertical distance between the outer surface of the cover plate and the plano-concave lens array.

10. The display and input apparatus according to claim 8, wherein the apertures on the convex lens array and the light shielding layer are evenly distributed on the sensor array and cover the sensor array.

11. The display and input apparatus according to claim 1, wherein an angular magnification GW of the plano-concave lens satisfies the following formula:

$GW \cdot D2/D1 < 1$, wherein D1 denotes a vertical distance between an outer surface of the cover plate and the plano-concave lens array, and D2 denotes a vertical distance between the plano-concave lens array and the sensor array.

12. The display and input apparatus according to claim 1, wherein a size Ps of the photosensitive pixel satisfies the following formula:

$Ps \le GW \cdot LM \cdot D2/D1$, wherein LM denotes an average width of a strip of a fingerprint or a minimum size of a to-be-identified character or graphic in a document, D1 denotes a vertical distance between an outer surface of the cover plate and the plano-concave lens array, D2 denotes a vertical distance between the plano-concave lens array and the sensor array, and GW denotes an angular magnification of the plano-concave lens.

13. The display and input apparatus according to claim 1, wherein the display array comprises organic light-emitting diodes or inorganic light-emitting diodes.

14. The display and input apparatus according to claim 1, wherein the photosensitive pixels in the sensor array comprise amorphous silicon photodiodes or crystalline silicon photodiodes.

* * * * *